United States Patent

Mahapatra et al.

[11] Patent Number: 5,963,034
[45] Date of Patent: Oct. 5, 1999

[54] ELECTRO-OPTIC ELECTROMAGNETIC FIELD SENSOR SYSTEM WITH OPTICAL BIAS ADJUSTMENT

[75] Inventors: Amaresh Mahapatra, Acton; Vincent E. Stenger, Boxborough, both of Mass.

[73] Assignee: Ramar Corporation, Northboro, Mass.

[21] Appl. No.: 08/975,349

[22] Filed: Nov. 20, 1997

Related U.S. Application Data

[63] Continuation of application No. 08/710,582, Sep. 19, 1996, abandoned.

[51] Int. Cl.[6] .................................................. G01R 33/02
[52] U.S. Cl. ................... 324/244.1; 324/96; 250/227.14; 356/351
[58] Field of Search ........................... 324/95, 96, 244.1, 324/260; 250/227.11, 227.14, 227.17, 231.1; 356/351, 352, 345, 346

[56] References Cited

U.S. PATENT DOCUMENTS

| | | | |
|---|---|---|---|
| 4,598,039 | 7/1986 | Fischer et al. | 430/323 |
| 4,899,042 | 2/1990 | Falk et al. | 324/244.1 |
| 5,041,779 | 8/1991 | Hales | 324/96 |
| 5,189,713 | 2/1993 | Shaw | 385/2 |
| 5,225,668 | 7/1993 | Hilliard et al. | 250/206.2 |
| 5,227,715 | 7/1993 | Ito et al. | 324/96 |
| 5,267,336 | 11/1993 | Sriram et al. | 385/2 |
| 5,278,499 | 1/1994 | Ito et al. | 324/244.1 |
| 5,280,173 | 1/1994 | Morse et al. | 250/227.23 |
| 5,384,458 | 1/1995 | Hilliard et al. | 250/227.17 |
| 5,389,782 | 2/1995 | Hilliard | 250/227.17 |
| 5,408,566 | 4/1995 | Eda et al. | 385/131 |

OTHER PUBLICATIONS

Department of Defense; Small Business Innovation Research Program (SBIR); FY 1993 SBIR Solicitation Phase I Award Abstracts Air Force Projects; vol. III; AD–A282890; pp. i–v and 109; (1994).

Bulmer, C. H. and Hiser, S. C., "Linear Ti:LiNbO$_3$ Modulators at 1.3 $\mu$m for Electromagnetic Field Sensing," *Integrated Optical Circuit Engineering*, SPIE vol. 517, pp. 177–185 (1984).

Duchet, C., "Integrated Electro–Optic Modulators with High Sensitivity for Remote Voltage Sensing," *Fiber Optic Sensors*, SPIE vol. 586, pp. 45–50 (1985).

Bridges, W. B., et al., "Wave–Coupled LiNbO$_3$ Electroooptic Modulator for Microwave and Millimeter–Wave Modulation,"*IEEE Photonics Technology Letters*, vol. 3, No. 2, pp. 133–135 (Feb. 2, 1991).

Sheehy, F., et al., "60 GHz and 94 GHz Antenna–Coupled LiNbO$_3$ Electrooptic Modulators," *IEEE Photonics Technology Letters*, vol. 5, pp. 307–310 (Mar. 3, 1993).

(List continued on next page.)

*Primary Examiner*—Jay Patidar
*Attorney, Agent, or Firm*—Hamilton, Brook, Smith & Reynolds, P.C.

[57] ABSTRACT

An electro-optic electromagnetic field sensor system includes an electro-optic sensor located at an electromagnetic field sensing site for detecting an intensity of an electromagnetic field. The sensor changes an optical measuring signal received from a laser source to an optical sensor signal representative of the electromagnetic field intensity. An optical bias adjust unit optically coupled to the laser source adjusts the bias operating point of the electro-optic sensor responsive to an electrical bias adjust signal which includes a test signal component. A detector optically coupled to the electro-optic sensor converts the optical sensor signal to an electrical sensor signal and detects a feedback signal indicative of the transfer function of the electro-optic sensor operating on the test signal component. A bias control circuit electrically coupled to the optical bias adjust unit generates the bias adjust signal responsive to the feedback signal. An optical input fiber couples the optical measuring signal from the laser source to the electro-optic sensor and an optical output fiber couples the optical sensor signal to the detector.

47 Claims, 11 Drawing Sheets

OTHER PUBLICATIONS

Choi, Y. K., et al., "Measurement of Low Frequency Electric Field Using Ti: LiNbO$_3$ Optical Modulator," *IEEE Proceedings-J*, vol. 140, pp. 137–140 (Apr. 2, 1993).

Tajima, K., et al., "Highly Sensitive Electric Field Sensor Using LiNbO$_3$ Optical Modulator," *IEICE Transactions*, vol. E 74, pp. 1941–1943 (Jul., 1991).

Bulmer, C. H., "Sensitive, Highly Linear Lithium Niobate Interferometers for Electromagnetic Field Sensing," *Appl. Physics Lett.*, vol. 53, pp. 2368–2370 (Dec. 12, 1988).

Baglikov, V. B., et al., "Investigation of an Electric Field Sensor Based on an Integrated Optical Mach–Zehnder Modulator," *Sov. J. Quantum Electron.*, pp. 1353–1355 (Oct., 1988).

Kuwabara, N., et al., "Development and Analysis of Electric Field Sensor Using LiNbO$_3$ Optical Modulator, " *IEEE Transactions on Electromagnetic Compatibility* 34, Issue 4, pp. 391–396 (Nov., 1992).

Kuwabara, N., et al., "Frequency Response Improvement of Electric Field Sensor Using Optical Modulator, " Conference Proceedings 10th Anniversary, IMT/94 Advanced Technologies in I & M, vol. 1, 1994 IEEE Instrumentation and Measurement Technology Conference, pp. 21–4 (1994).

Kondo, M., et al., "Reflection type Electro–Optic Electric Field Sensor with LiNbO$_3$ Optical Waveguide," 1994 International Symposium on Electromagnetic Compatibility, pp. 774–777 (1994).

ELECTRO-OPTIC ELECTROMAGNETIC FIELD SENSOR SYSTEM WITH OPTICAL BIAS ADJUSTMENT

This application is a continuation of application Ser. No. 08/710,582, filed on Sep. 19, 1996, now abandoned, which is incorporated herein by reference in its entirety.

GOVERNMENT SUPPORT

The invention described herein was supported in whole or in part by SBIR Contract Nos. F29601-93-C-0051 and F29601-94-C-0121 from the United States Air Force. The government has certain rights in the invention.

BACKGROUND OF THE INVENTION

The invention relates generally to remote sensing of electromagnetic fields, and more particularly to sensor systems using electro-optic sensors.

Lithium niobate devices have been used for electromagnetic field sensing. Several concepts have been proposed to increase the sensitivity of such devices while others have focused on increasing the frequency bandwidth of the devices. Electromagnetic field sensing applications are wide varying. Sensor designs generally attempt to meet one or more of the following criteria: (i) minimal perturbance of the electromagnetic field; (ii) well-characterized frequency response over a broad frequency range; (iii) large dynamic range; and (iv) small size to allow spatially resolved measurements in small regions. However, prior sensor designs have not been known to be able to discriminate against environmental variables such as temperature, vibration, pressure and humidity.

Lithium niobate integrated optic modulators are suitable transducers for field sensing applications. Since such devices are both powered and interrogated over optical fibers, the detecting and measuring hardware can be located remotely from the sensing site so that there is minimal perturbation of the fields being measured. Lithium niobate integrated optic modulators are compact, lightweight, and can have high potential bandwidth and high voltage sensitivity.

Known lumped element electrode structures for sensing applications are limited in bandwidth to about 1 or 2 GHz. In a field sensing application, the electrodes on the lithium niobate devices are typically connected to antennas. Broadband matching of electrode and antenna impedances is difficult. For many antenna designs, the electrode transmission line cannot be terminated in its characteristic impedance without severely loading the antenna. One way to increase bandwidth is to use short electrodes with very small capacitance so that even at the highest desired frequency the antenna is not loaded. However, the voltage sensitivity of the sensor device goes down in proportion to decreased electrode length.

SUMMARY OF THE INVENTION

The above and other problems are solved by the electro-optic electromagnetic field sensor system of the present invention. One aspect of the present invention uses a resonant Fabry-Perot structure to enable use of short electrodes without equivalent sacrifice in voltage sensitivity. Another aspect involves the application of special broadband antenna designs in impedance matching to transmission line electrodes, thereby increasing the frequency bandwidth and sensitivity of the sensor device.

Accordingly, an electro-optic electromagnetic field sensor system comprises an electro-optic sensor located at an electromagnetic field sensing site for detecting an intensity of an electromagnetic field. An optical input fiber couples an optical measuring signal from a laser source to the electro-optic sensor and an optical output fiber couples an optical sensor signal to a photodetector. The sensor changes the optical measuring signal received from the laser source to the optical sensor signal which is representative of the electromagnetic field intensity. Environmental drifts in the optical bias point of the electro-optic sensor are remotely compensated to maintain the optimum bias responsive to an electrical bias control signal which includes a test signal component. The electrical bias control signal is coupled to an optical bias adjust unit which adjusts either the laser wavelength or the polarization state of the optical measuring signal. The photodetector, optically coupled to the output of the electro-optic sensor over optical fiber, converts an optical bias control feedback signal and sensor signal to an electrical feedback signal and sensor signal. The feedback signal is derived from the bias control test signal and is indicative of the bias point of the electro-optic sensor.

In a preferred embodiment, the electro-optic sensor is a Fabry-Perot resonator. In another preferred embodiment, the sensor is a phase modulator coupled to a polarization mixer. For the resonator based sensor, the optical wavelength of the measuring signal is adjusted to compensate for drifts in the optical bias point. For the phase modulator based sensor, the polarization state of the optical measuring signal is adjusted to compensate for bias drifts.

To separate the bias control test signal component from the sensor signal on the output, a field-isolated reference waveguide channel is placed in close proximity to the field sensor channel such that any environmental effects are equal between the two channels. The output of the reference channel is directly used by the bias control unit for environmental compensation. If the bias control test signal is well out of the frequency band of the field being measured, electrical filters are used to separate bias control and sensor signal components, and a reference channel is not used.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views.

DETAILED DESCRIPTION OF THE PREFERRED EMBODIMENTS

Figure 1:
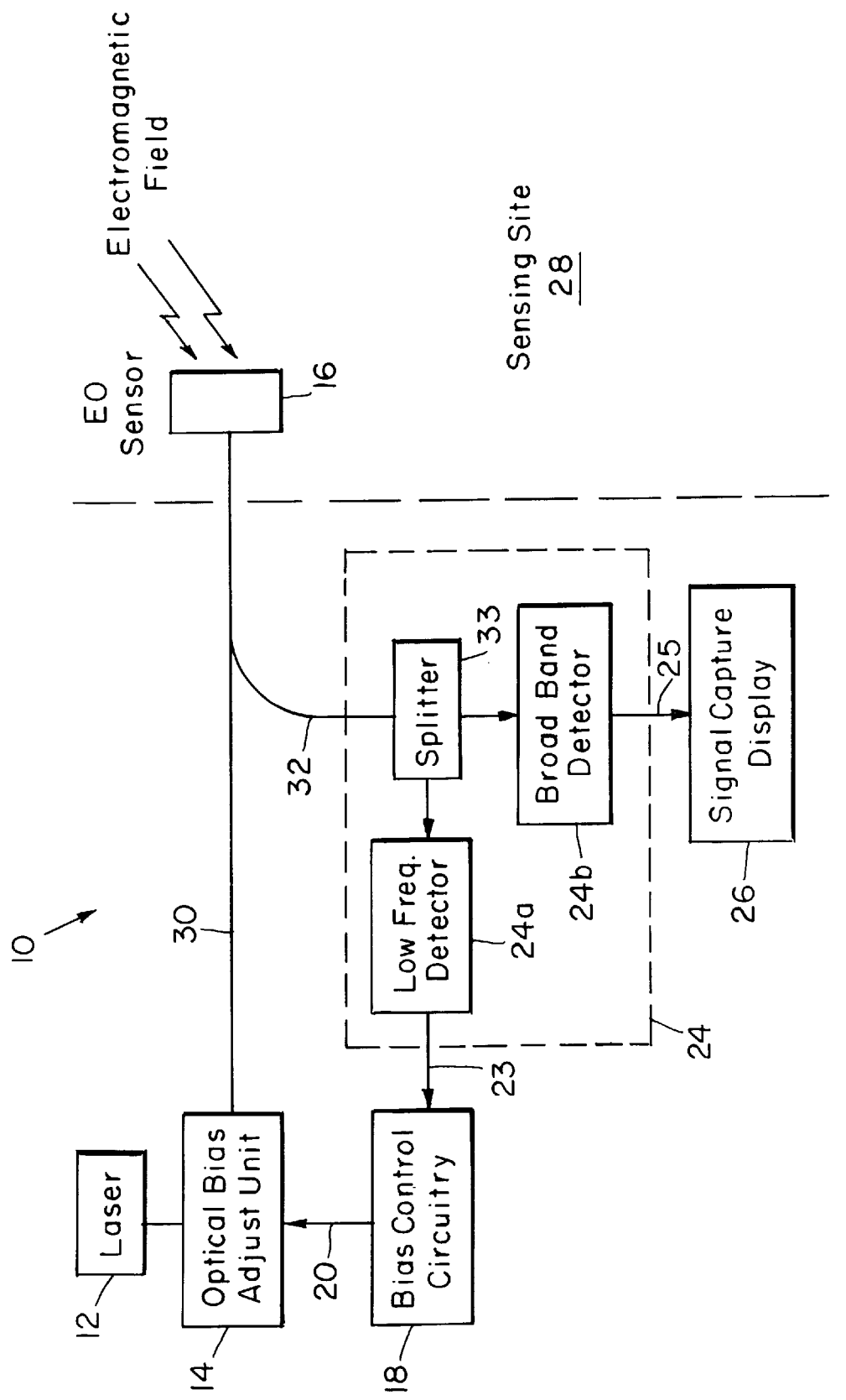
FIG. 1 is a schematic block diagram of an electro-optic electromagnetic field sensor system in accordance with the present invention.

Referring now to FIG. 1, an electro-optic electromagnetic field sensor system 10 is shown which illustrates the principles of the present invention. The system 10 generally comprises a laser source 12, an optical bias adjust unit 14, an electro-optic sensor 16, bias control circuitry 18, an optical detector 24, and signal capture and display unit 26. The system 10 uses feedback control to adjust remotely the optical bias operating point of the electro-optic sensor 16. The techniques used for remote adjustment of the optical bias depend on the type of electro-optic sensor 16 employed, as discussed further below in relation to the preferred embodiments.

The laser source 12 provides an optical measuring signal to the optical bias adjust unit 14 which is operative to adjust the optical bias point of the electro-optic sensor 16 in response to bias control signal 20 received from bias control circuitry 18. The bias control signal 20 includes a small AC test signal which is used for feedback control. An optical input fiber 30 couples the optical measuring signal received from the optical bias adjust unit 14 at one end to the electro-optic sensor 16 at the other end. The optical input fiber 30 is preferably a polarization-maintaining fiber.

The electro-optic sensor 16 located at a sensing site 28 detects an intensity of an electromagnetic field and changes the optical measuring signal to an optical sensor signal that is representative of the electromagnetic field intensity. An optical output fiber 32 couples the optical sensor signal from the electro-optic sensor 16 at one end to the optical detector 24 at the other end. The detector 24 includes a splitter 33, a low frequency detector 24a, and a broadband detector 24b. The splitter 33 preferably splits the optical sensor signal 90% to the broadband detector 24b and 10% to the low frequency detector 24a. The broadband detector 24b converts the optical sensor signal to an electrical sensor signal 25 and the low frequency detector 24a detects a feedback signal 23 indicative of the transfer function of the electro-optic sensor 16 operating on the test signal component of the bias control signal 20. The bias control circuitry 18 receives the feedback signal 23 which is processed to generate bias control signal 20.

The optical measuring signal provided by laser source 12 includes polarized optical components of TE and TM modes which are orthogonal to each other. One of the polarized optical components of TE and TM modes is propagated through the polarization-maintaining fiber 30 in the direction of X-axis polarization. The other polarized optical component of TE and TM modes is propagated in the direction of Z-axis polarization.

Figure 2:
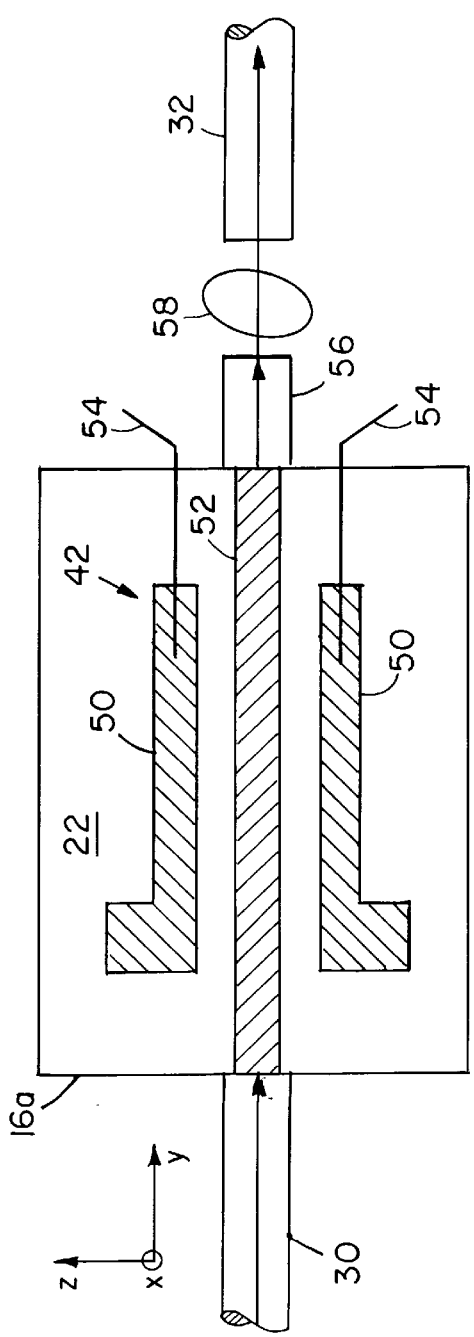
FIG. 2 is a schematic diagram of a preferred embodiment of an electro-optic sensor for use in the system of FIG. 1 in accordance with the present invention.

Two different types of electro-optic sensors are preferred for use in the system 10: polarization mixing sensors and Fabry-Perot resonators. Referring now to FIG. 2, there is shown a preferred embodiment of a polarization mixing sensor generally designated 16a. The sensor 16a comprises a phase modulator 42 formed on a substrate 22 and field sensing antennas 54. The substrate 22 can be, for example, X-cut, Y-propagating lithium niobate. The phase modulator 42 includes electrodes 50 to which the antennas 54 are connected and a waveguide channel 52 for conducting the optical measuring signal received from the polarization-maintaining fiber 30 to output fiber pigtail 56. The field sensing antennas 54 detect the intensity of an electromagnetic field and produce an electrical intensity signal having an amplitude proportional to the electromagnetic field intensity. The electrical intensity signal is applied to the phase modulator 42 through electrodes 50.

As noted, the optical measuring signal includes polarized optical components of TE and TM modes. Since the electro-optic constant seen by the polarized optical components of TE and TM modes traveling through the waveguide 52 are different for each mode, the electrical intensity signal applied through electrodes 50 causes a phase difference to be produced between the two polarized optical components in an amount proportional to the amplitude of the electrical intensity signal. The sensor response is sinusoidal over TE to TM differential phase shift.

In order to measure the phase difference and hence the intensity of the electromagnetic field, the two polarized optical components are optically mixed. The polarization maintaining fiber pigtail 56 extends from the sensor 16a to couple light to a polarizer plate 58 oriented at 45 degrees offset from both the X and Z-axes. The polarizer plate 58 which can be, for example, a LAMIPOL™ plate provided by Sumitomo, optically mixes the phase-shifted polarized optical components of TE and TM modes received from the phase modulator 42 to produce an optical amplitude modulation signal proportional to the phase difference between the polarized optical components. Alternatively, the polarizer plate 58 can be affixed directly to the output facet of the sensor 16a at 45 degrees offset. In an alternative embodiment described later, the optical mixing is provided using a length of polarizing fiber.

Note that the bandwidth of the polarization mixing sensor 16a is limited by the capacitance of the electrodes 50. For a given voltage of the electrical intensity signal, the modulation depth depends on the relative magnitude of the TE and TM modes and the orientation of the mixing polarizer plate 58. However, for small signals the modulation is close to linear and it is the small signal modulation bandwidth that is typically used to characterize the electrode structure.

Figure 3:
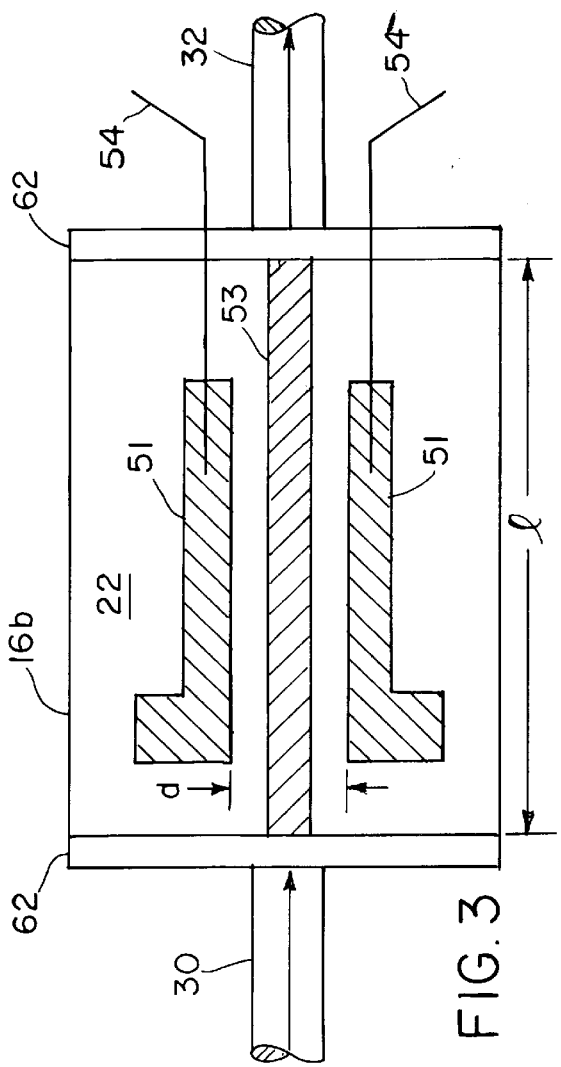
FIG. 3 is a schematic diagram of another preferred embodiment of an electro-optic sensor for use in the system of FIG. 1 in accordance with the present invention.

Referring now to FIG. 3, there is shown a preferred embodiment of a sensor of the Fabry-Perot resonator type generally designated 16b. The resonator 16b comprises field sensing antennas 54, electrodes 51, mirrors 62, and a waveguide channel 53. The waveguide channel 53 can be fabricated by several methods including titanium diffusion and proton exchange. The guide is fabricated in a lithium niobate substrate 22. The ends of the lithium niobate substrate 22 are polished and the mirrors 62 are deposited on the cross-section of waveguide channel 53. These mirrors 62 can be dielectric mirrors with reflectivity on the order of 0.99 or metallic mirrors with lower reflectivity.

The waveguide channel 53 conducts the optical measuring signal received from the polarization-maintaining fiber 30. The antennas 54 detect the intensity of an electromagnetic field and produce an electrical intensity signal having an amplitude proportional to the electromagnetic field intensity. The electrical intensity signal is applied to the waveguide channel 53 through electrodes 51.

The following discussion describes the theoretical basis for the resonator device in FIG. 3. The finesse of a resonator, F, defined as the separation of consecutive resonances divided by the width of a resonance, is given by:

$$F = \pi \sqrt{\frac{R}{(1-R^2)}} \quad \text{(Eq. 1)}$$

where R is the reflectivity of the mirrors 62. This assumes that the propagation loss in the resonator is small which is a good assumption for a very short resonator. Even with metallic mirrors it is possible to have reflectivity of 0.97. This yields a finesse of about 60.

Figure 4:
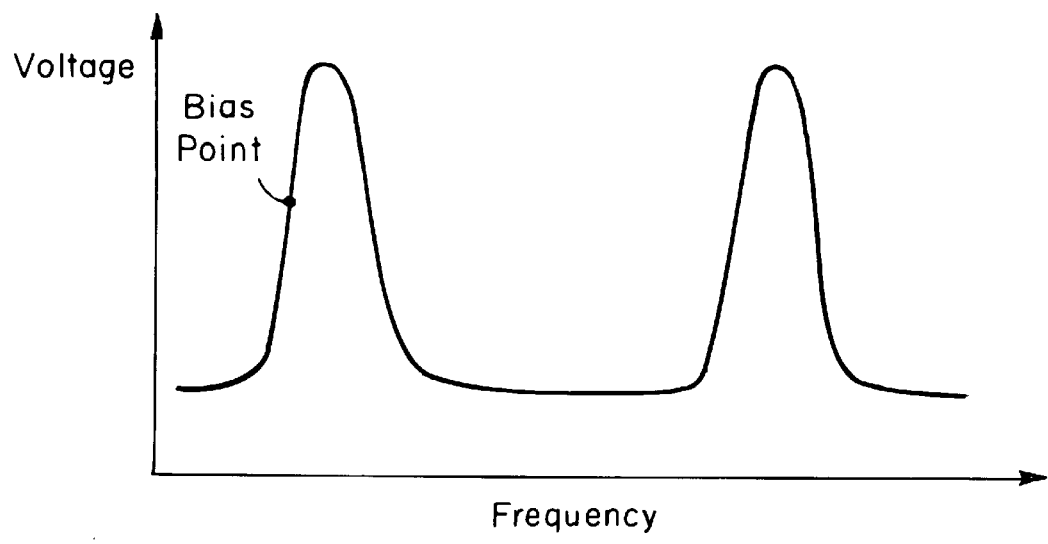
FIG. 4 shows a typical resonance curve for a resonator of the sensor of FIG. 3.

FIG. 4 shows a typical resonance curve for a Fabry-Perot resonator. The frequency span between resonances is called the free spectral range. Application of voltage to the electrodes 51 changes the refractive index of lithium niobate which changes the location of the resonances without changing the free spectral range. The change in index, $\Delta$, necessary to tune through one resonance is given by:

$$2\Delta nl = \lambda \quad \text{(Eq. 2)}$$

where 1 is the length of the resonator and $\lambda$ is the optical wavelength. The change in refractive index with voltage for an electro-optic crystal is given by:

$$\Delta n = \frac{n^3 rV}{2d} \quad \text{(Eq. 3)}$$

where n is the refractive index of lithium niobate, r is the relevant electro-optic constant, V is the applied voltage and d is the separation of the electrodes. Using equation 3 in equation 2, the voltage to tune through one resonance, $V_\pi$ is given by:

$$V_\pi = \frac{\lambda d}{lrn^3} \quad \text{(Eq. 4)}$$

For x-cut, y-propagating guides in lithium niobate, the relevant electro-optic constant is $r_{33}$. For example, where $\lambda=0.8$ $\mu$m, d=5 $\mu$m, l=1 mm, n=2.2 and $r_{33}=30\times10^{-12}$ m/V, equation 4 yields $V_\pi=20.4$ volts. This means that in FIG. 4, 20.4 volts applied to the electrodes 51 can move one resonance over to the next, leaving the picture unchanged. In practice, a much smaller movement of a resonance can be detected. For instance, for a voltage of $V_\pi/F$, the resonance moves by its full width at half maximum (FWHM). Therefore, voltages as small as $V_\pi/F$ or smaller can be detected by the resonator device. For a structure with finesse of 100, the effective $V_\pi$ in the above example is reduced to 0.2 volts. Note that the capacitance of electrodes on lithium niobate is about 0.7 pF/mm. Thus, the impedance of 1 mm long electrodes at 10 GHz is about 23 ohms. Note that a standard phase modulator on lithium niobate with a $V_\pi$ of 0.1 volts would have a length of 10 cm with an impedance of 0.2 ohms at 10 GHz.

Figure 5:
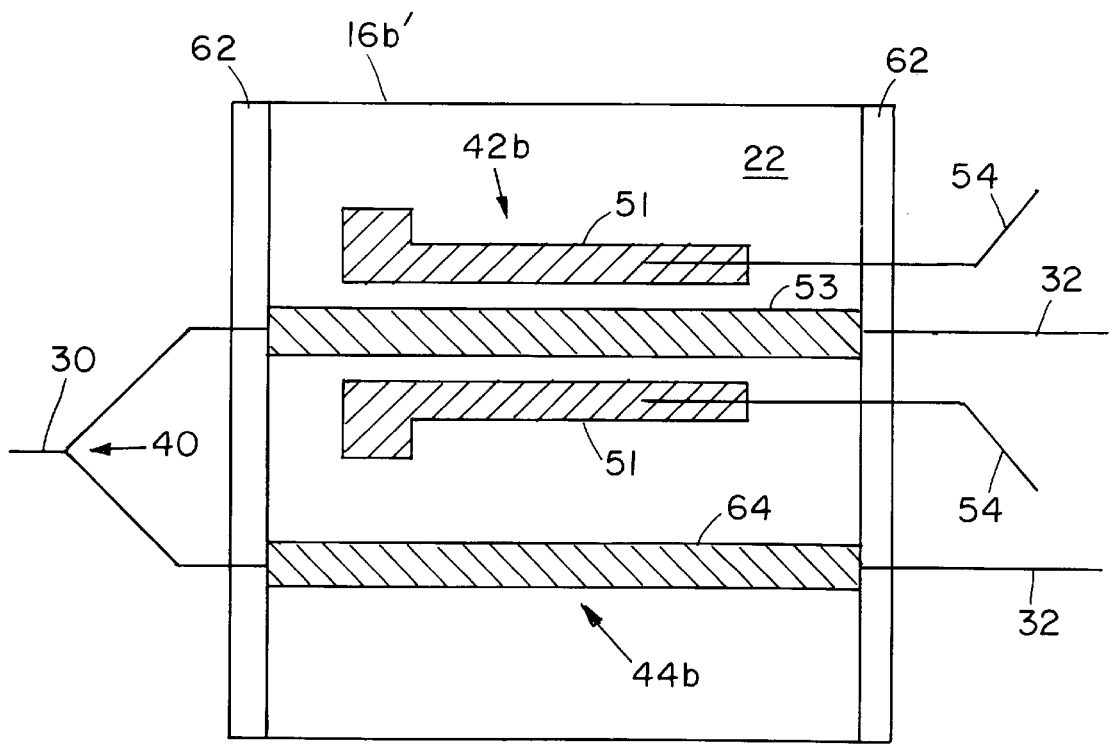
FIG. 5 is a schematic diagram of a preferred embodiment of an electro-optic sensor including a reference waveguide in accordance with the present invention.

One potential problem with resonant structures is the stability of the resonance. The resonance location can drift with temperature and the wavelength of the optical source. To correct for these variables, a reference resonator can be added onto the same substrate, as shown in FIG. 5. A sensor 16b' is shown comprising a sensing resonator 42b and a reference resonator 44b. The sensing resonator 42b includes antennas 54, electrodes 51, and waveguide channel 53. The reference resonator 44b comprises a waveguide channel 64. The waveguide channels 53, 64 can be fabricated by several methods including titanium diffusion and proton exchange. The guides are fabricated in a lithium niobate substrate 22. The ends of the lithium niobate substrate 22 are polished and the reflective mirrors 62 are deposited on the cross-section of waveguide channels 53 and 64. A light splitter 40 coupled to one end of the sensor 16b' splits the optical measuring signal received from the laser source 12 through polarization-maintaining fiber 30 to provide a portion of the optical measuring signal to each of the waveguide channels 53, 64.

The resonators 42b, 44b are located on the substrate 22 in close proximity to each other and therefore are affected by the same temperature fluctuations. However, the field sensing antennas 54 is applied only to the sensing resonator 42b. Since the same laser source feeds both resonators through the polarization-maintaining fiber 30, wavelength shifts influence resonance locations nearly identically for both resonators. Similarly, other environmental factors such as temperature, pressure and humidity affect both resonators identically due to their close proximity. Thus, electronic comparison of differential movement of resonances can be used to monitor electromagnetic fields. A reference waveguide also can be used with the polarization mixing type of sensor, as discussed below.

In preferred embodiments the reference resonator 44b can be biased to its half-power point using a feedback loop discussed further below. Controlling the bias of the reference resonator 44b ensures that the sensing resonator 42b is also at its half-power bias point since both resonators have substantially identical resonance. Any variation in the power output of the sensing resonator 42b can then be attributed to electromagnetic fields picked up by the antennas 54 since all other parameters affect both resonators equally.

As noted, to assure that the resonators 42b and 44b experience nearly identical environmental effects, they are located in close proximity to each other. For example, for two resonators 4 microns wide, a separation of 150 microns on the same substrate was found to provide good results. Note that as long as the resonances of the two resonators overlap to some extent, the reference resonator can be used to keep the sensing resonator biased to its half-power point merely through a one-time correction for the small non-coincidence of resonances.

Figure 6:
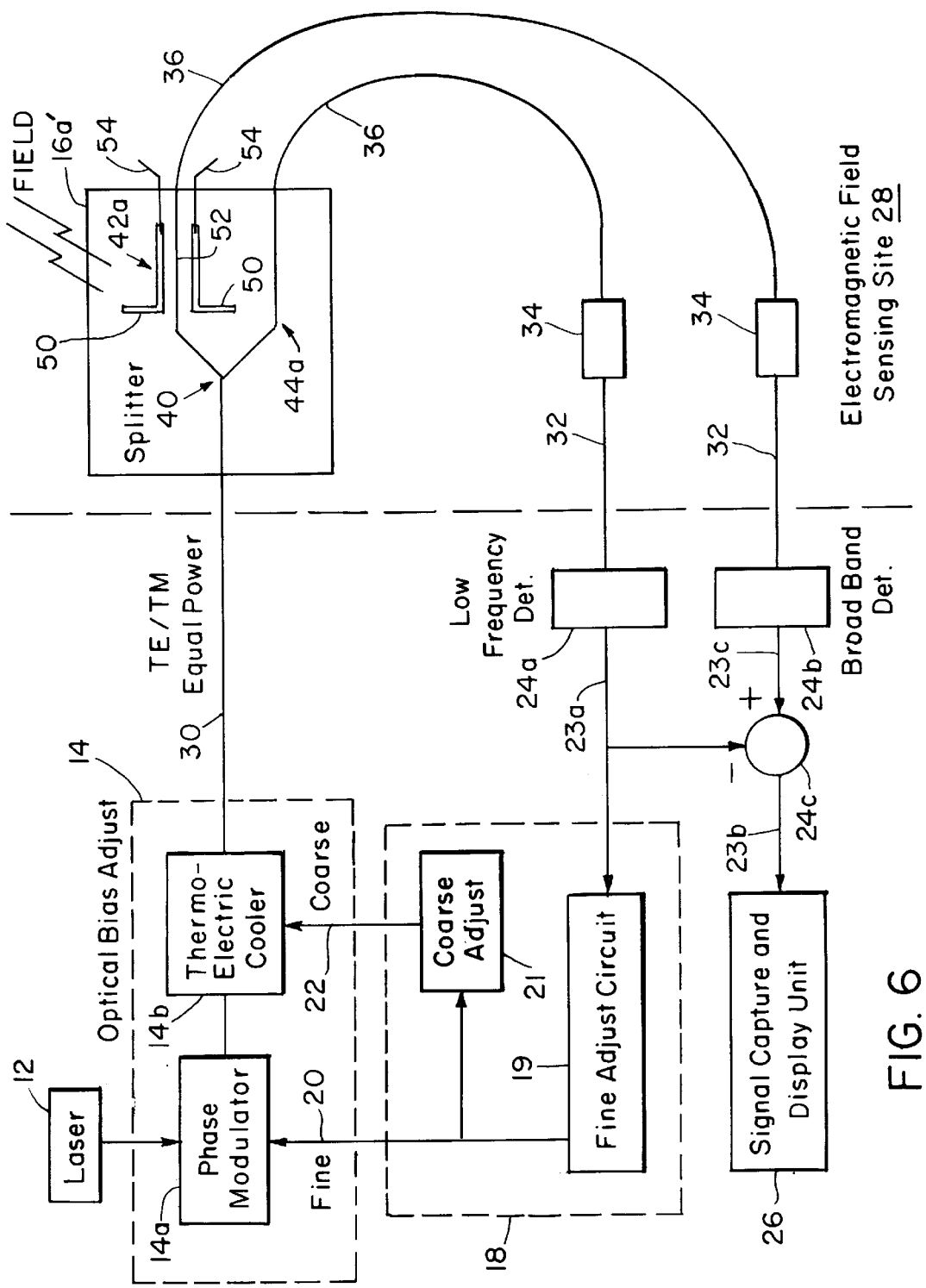
FIG. 6 is a schematic block diagram of a preferred embodiment of an electro-optic electromagnetic field sensor system in accordance with the present invention.

Referring now to FIG. 6, a preferred embodiment of an electro-optic electromagnetic field sensor system is shown that includes a polarization mixing sensor generally designated 16a'. The system comprises laser source 12, optical bias adjust unit 14, bias control circuitry 18, signal capture and display unit 26, low frequency photodetector 24a, broadband photodetector 24b, and the sensor 16a'. The sensor 16a', located at an electromagnetic field sensing site 28, comprises a splitter 40, a phase modulator 42a, and reference modulator 44a. The phase modulator 42a includes waveguide 52, electrodes 50, and antennas 54. The splitter 40 splits the optical measuring signal received from the laser source 12 through polarization-maintaining fiber 30 to provide a portion of the optical measuring signal to each of the modulators 42a, 44a.

The modulators 42a, 44a are located on the substrate of sensor 16a' in close proximity to each other and therefore are affected by the same temperature fluctuations. However, the field sensing antennas 54 is applied only to the phase modulator 42a. Since the same laser source feeds both modulators through the polarization-maintaining fiber 30, environmental factors such as temperature, pressure and humidity affect both modulators the same due to their close proximity.

Each of the outputs from modulators 42a, 44a is coupled to a length of polarizing fiber 36 that optically mixes the phase-shifted polarized optical components of TE and TM modes received from the modulators 42a, 44a to produce an optical amplitude modulation signal proportional to the phase difference between the polarized optical components. The length of polarizing fibers 36 is in the range of about 1 to 3 meters. The polarizing fibers 36, which are available from 3M, are each coupled to a single-mode fiber 32 through a fusion splice 34. The optical amplitude modulation signal is propagated through the single-mode fibers 32 to detectors 24a, 24b. The low frequency detector 24a extracts feedback control information as described further below. The broadband detector 24b detects the optical amplitude modulation signal indicative of the intensity of the sensed electromagnetic field. To sense fields within the bias control signal frequency range, a difference signal 23b for discriminating the outputs of phase modulator 42a and reference modulator 44a is generated by subtracting feedback signal 23a from the sensed signal 23c at differentiator 24c. The difference signal 23b is applied to the signal capture and display unit 26 for processing and display.

For applications in which the sense signal is out of band of the bias control signal (e.g., fields>>10 kHz), a reference modulator 44b is not needed. Instead, the output of the phase modulator 42a can be split using an optical splitter to direct a portion of the signal to the separate low and high frequency detectors 24a, 24b respectively.

The laser source 12 provides an optical measuring signal to the optical bias adjust unit 14 which includes a phase modulator 14a for finely adjusting the optical bias point of the electro-optic sensor 16a' in response to a fine bias control signal 20 received from bias control circuitry 18. The fine bias control signal 20 includes a small AC test signal which is used for feedback control. The optical bias adjust unit 14 further includes a thermo-electric cooler for coarsely adjusting the bias point of sensor 16a' in response to a coarse bias control signal 22 received from bias control circuitry 18.

As noted, a feedback loop is implemented by adding a small AC test signal to the DC level of the fine bias control signal 20. The test signal is on the order of a couple of percent of the full sensor bias range. The low frequency detector 24a detects a feedback signal 23a indicative of the transfer function of the electro-optic sensor 16a' operating on the test signal component. The bias control circuitry 18 includes a fine adjust circuit 19 that processes the feedback signal 23a to generate fine bias control signal 20. A portion of the fine bias control signal is provided as input to a coarse adjust circuit 21 that generates the coarse bias control signal 22.

For a polarization mixing sensor such as the device 16a' or the device 16a shown in FIG. 2, the intensity modulation stems from the degree of phase shift between TE and TM polarization modes in the sensor waveguide channel 52. As noted, the sensor response is sinusoidal over TE to TM differential phase shift. A remote adjustment of this phase shift is effected by inserting an integrated optic tunable waveplate, or phase modulator device 14a at the output of the laser 12. The input of the phase modulator 14a is aligned to excite both TE and TM modes equally. The fine bias control signal 20 is applied to the phase modulator 14a to correct or adjust the phase shift of the sensor 16a'.

In a typical sensor system application, the polarization-maintaining fiber 30 can be tens of meters in length. Temperature fluctuations over the fiber span to the sensor 16a' can generate large differential phase shifts between the TE and TM optical polarizations. The integrated optic phase modulator 14a can compensate about $4\pi$ to $5\pi$ differential phase shifts over the range of the applied fine bias control signal 20. For PANDA polarization-maintaining fibers, the thermal coefficient of birefringence is known to appear constant in the 31 20 to 100° C. temperature range at about $22\pi$ rad/10 cm length per 100° C. or $2.2\pi$ rad/m° C. Over a 30 meter fiber, this translates into a thermal induced phase shift of $66\pi$ rad/°C. Thus the phase modulator 14a can compensate for only 5/66° C. or about 1/12 of a° C. average temperature variation over the 30 meter length of the polarization-maintaining fiber 30.

Figure 7:
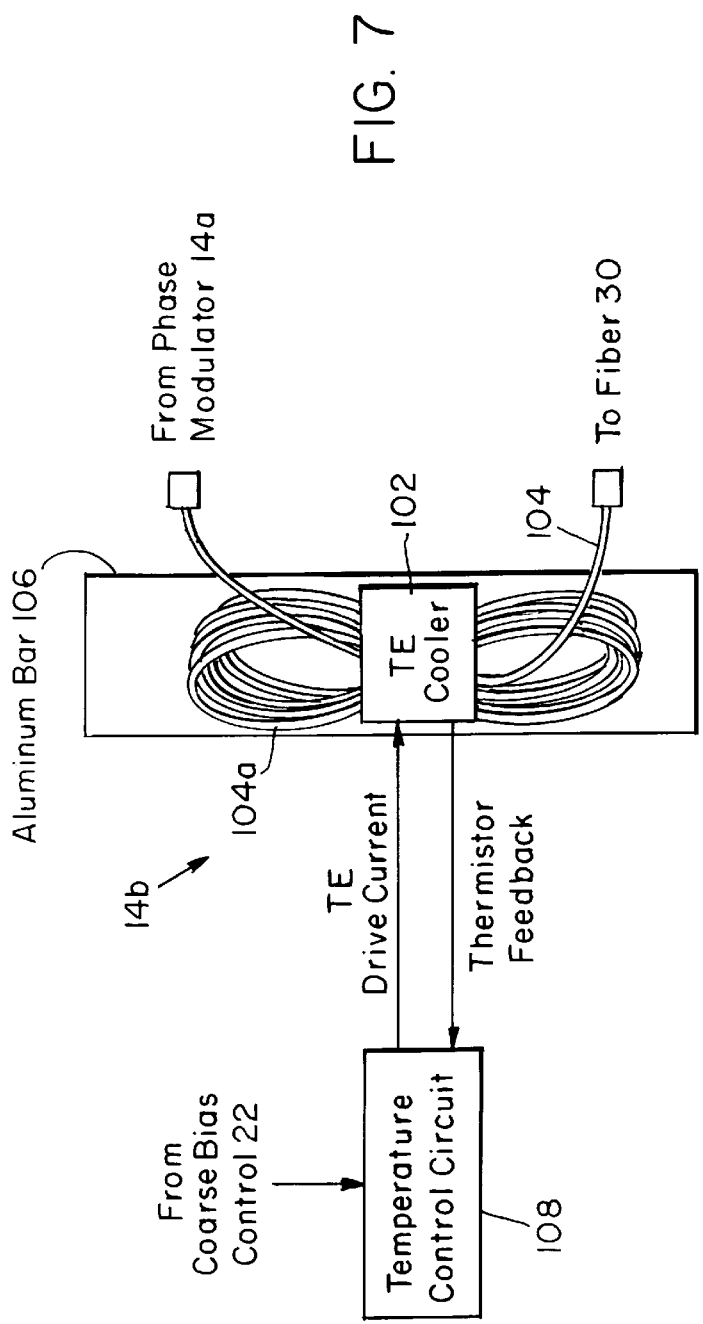
FIG. 7 is a schematic block diagram of a thermo-electric cooler arrangement for use in the sensor system of FIG. 6.

A coarse phase adjustment is provided by utilizing a thermo-electric cooler 14b to adjust the temperature of a section of polarization-maintaining fiber. A thermo-electric cooler arrangement 14b is shown in FIG. 7. The arrangement includes a thermo-electric cooler plate 102 disposed to contact a number of passes 104a of a looped patch cable 104 of polarization-maintaining fiber. The looped fiber patch cable 104 is interposed between the phase modulator 14a and the polarization-maintaining fiber 30 (FIG. 6). The inherent thermal coefficient of birefringence of the fiber induces a differential phase shift with applied temperature. Note that the fiber passes 104a are kept fairly straight to minimize the temperature dependent losses of the fiber due to loss of confinement. The bend radii of the fiber are kept above about 2 cm. An aluminum bar 106 is provided to support the fiber patch cable 104. A temperature control drive circuit 108 coupled to receive the coarse bias control signal 22 drives thermo-electric cooler plate 102 and receives feedback from a thermistor located on the cooler plate.

The thermo-electric cooler arrangement of FIG. 7 can generate a temperature range between 4 to 104° C. For an arrangement having 32 passes of a 6 meter polarization-maintaining fiber patch cable over a 1"×1" cooler surface, the net contact length is 32" or 0.81 meters. The total phase excursions over the temperature range of 100° C. for this arrangement is about $75\pi$. Therefore, with 100° C. control range of 0.81 meters of fiber, the thermo-electric cooler arrangement 14b can compensate for net temperature variations of 2.7° C. over the 30 meter fiber length, thereby increasing the compensation range of the optical bias adjustment by a factor of about 16.

Figure 8:
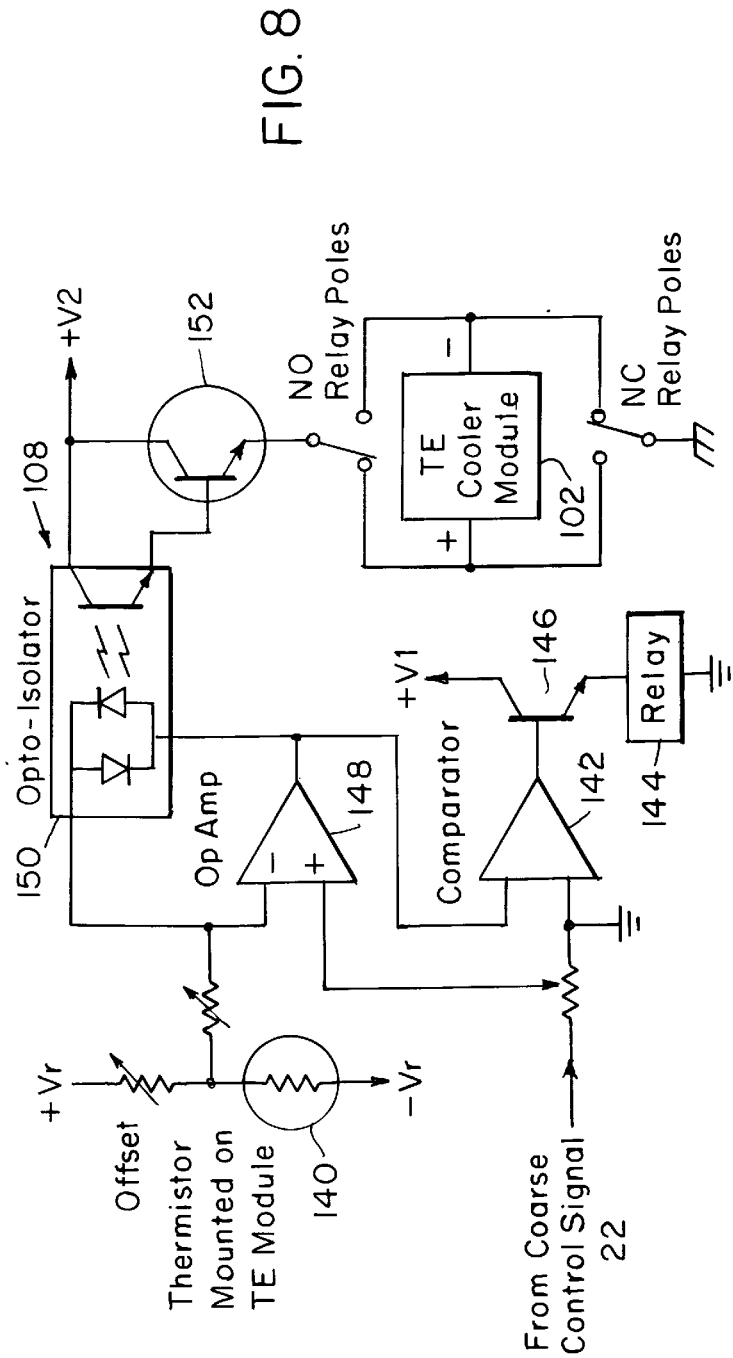
FIG. 8 is a schematic block diagram of a thermo-electric cooler driver circuit of the thermo-electric cooler arrangement of FIG. 7.

Referring now to FIG. 8, there is shown an exemplary thermo-electric cooler driver circuit. An amplifier 148 generates a bipolar LED current in opto-isolator 108 proportionate to the difference between the coarse control signal 22 and the existing level returned from the thermistor 140. This LED current drives the power transistor 152, and thus, the TE cooler module 102 at a proportionately higher current. Comparator 142 switches the polarity of the TE cooler current according to the LED current polarity of 108 via relay driver transistor 146 and relay 144. This circuit serves to drive the TE cooler linearly and bi-directionally using a single ended voltage supply indicated by +V2.

In another embodiment, the thermo-electric cooler system as previously described is applied to adjust the temperature of the bias phase modulator 14a (FIG. 6). The inherent thermal coefficient of birefringence of the TE an TM modes in the optical guide of the modulator 14a is then exploited to provide a coarse phase adjustment.

In another embodiment, temperature drifts over the length of the fiber span 30 between the laser source 12 and the sensor device 16a' (FIG. 6) can be minimized by employing an alternating alignment of a number of shorter lengths of fiber so as to maintain the same average phase difference between "fast" and "slow" axis polarizations over the net fiber span. Specifically, alternating the alignment of polarization-maintaining fiber patch cables over relatively short lengths (about 5 to 6 meters) serves to cancel or reduce large phase excursion due to fiber mode birefringence. For example, two alternating aligned fiber patch cables can be used in any region where temperature changes are to be expected, such as where the fiber span enters a new room or enclosure.

Referring again to FIG. 6, the bias control circuitry 18 will now be described. As noted, the bias control circuitry 18 generates a DC bias signal and an AC test signal for locking the sensor to a desired point of operation. The fine adjust circuit 19 processes the feedback signal 23a from detector 24a to generate the fine bias control signal 20. A portion of the fine bias control signal 20 is provided as input to the coarse adjust circuit 21 which generates the coarse bias control signal 22. The fine adjustment compensates for small, high speed environmental perturbations, while the coarse adjustment compensates for large or monotonic bias drifts that are typically slow changing. The coarse bias control signal 22 changes only so as to keep the fine bias control signal 20 within a set control window. This circuit arrangement prevents the bias control from losing lock to a sensor bias point and eliminates the need to reset to a new bias point. It should be noted that while preferred embodiments of the invention employ feedback/bias control circuitry for controlling the optical bias adjustment, the present invention encompasses embodiments not having such feedback control.

Figure 9:
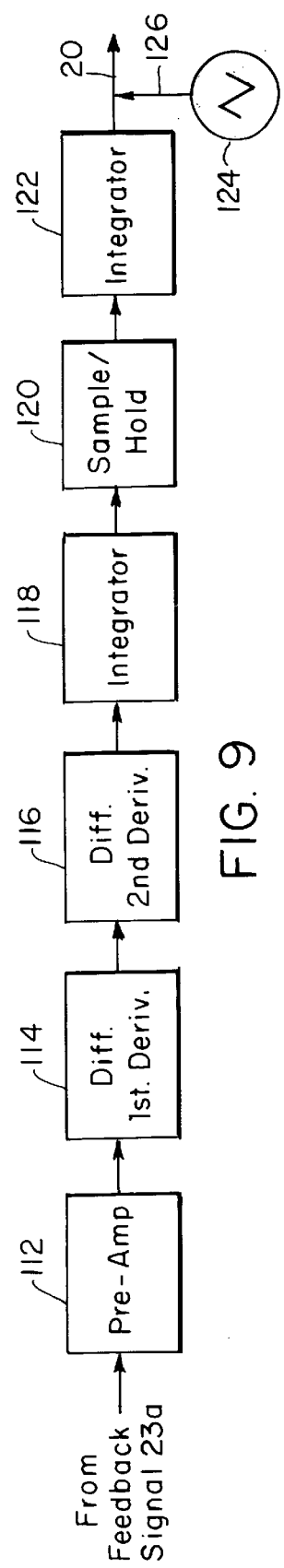
FIG. 9 is a schematic block diagram of a fine adjust bias control circuit for use in the sensor system of FIG. 6.

A schematic block diagram of an exemplary fine adjust circuit 19 is shown in FIG. 9. The circuit includes a pre-amp 112, and series of differentiator and integration stages 114, 116, 118, and 122 for processing the feedback signal 23a received from low frequency detector 24a (FIG. 6). The fine adjust circuit 19 provides a DC bias output 20 to which a small triangle wave test signal 126 at about 1 Khz from source 124 is added. The fine bias control signal 20 with the test signal 126 is applied to the phase modulator 14a (FIG. 6) to adjust the phase of the optical measuring signal.

The feedback signal 23a is input to a pre-amp 112 which amplifies the signal for further processing. Differentiator 114 provides a first derivative of the amplified feedback signal which represents the small signal gain at the operating point of the sensor 16a' (FIG. 6). The succeeding differentiator 116 provides a second derivative of the feedback signal which represents the second order nonlinearity at the sensor operating point.

RC time constant nonlinearities appear as AC components of the second derivative, while sensor operating point even-ordered nonlinearities appear as a net DC component. This DC component is accumulated over several cycles by integrator 118. Since there will still be an AC component due to finite integration time, a sample and hold circuit 120 is used to update and maintain a steady DC value over each half cycle of the test signal. The stepped DC values are then input to a slow integrator 122 to generate a linear correction ramp on top of the current DC output level. Note that this ramp slope is on the order of 10 times less than the test signal. Further, the high degree of linearity of the correction ramp (determined by the linearity of integrator 122) does not generate additional signal at the second derivative.

Figure 10:
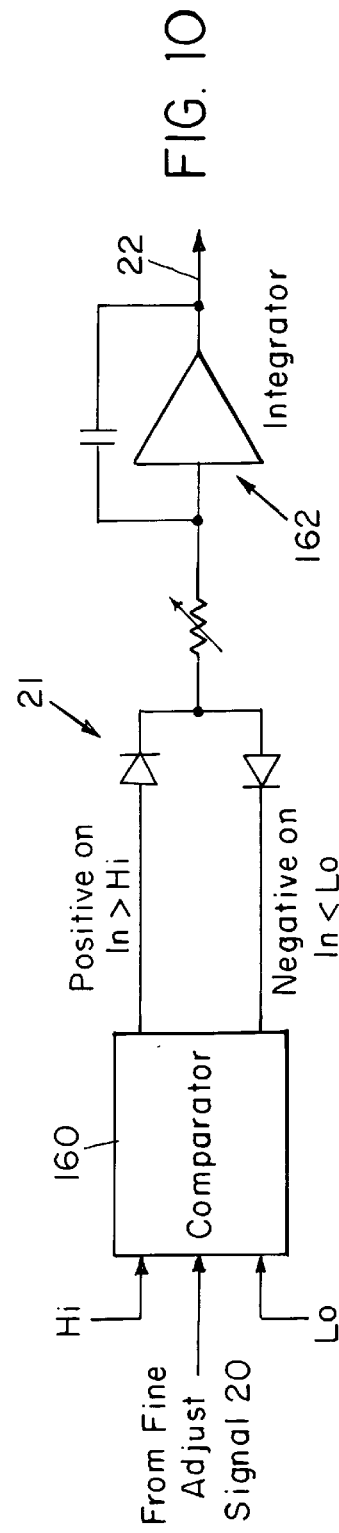
FIG. 10 is a schematic block diagram of a coarse adjust bias control circuit for use in the sensor system of FIG. 6.

Referring now to FIG. 10, a schematic block diagram of the coarse adjust circuit 21 is there shown. The coarse adjust circuit 21 serves to keep the fine bias control signal 20 from "hitting the rail" and thereby losing bias lock. As the fine bias control signal increases in magnitude, the coarse bias control signal 22 changes proportionately to minimize the total excursion of the fine bias control signal.

The coarse adjust circuit 21 includes a window comparator 160 coupled to an integrator 162. High and low limits are set in the comparator 160 corresponding to the preferred voltage range limits for the fine bias control signal 20. The comparator 160 compares the fine bias control signal 20 to these limits and outputs a positive level if the fine signal is greater than the high limit and a negative level if the fine signal is less than the low limit. The integrator 162 performs a slow integration of the output of the comparator 160 to provide a positive or negative sloping DC level at output 22.

Figure 11:
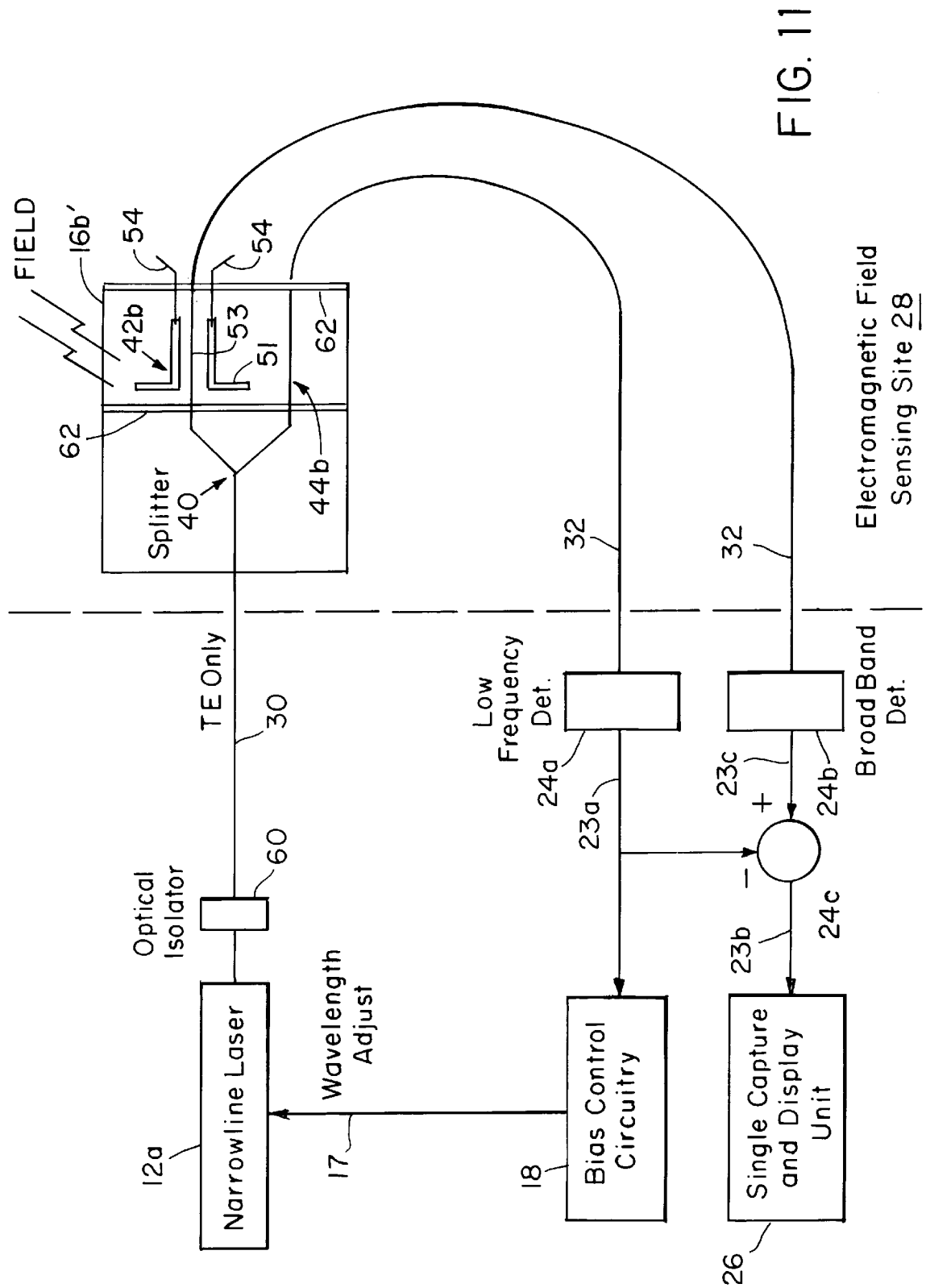
FIG. 11 is a schematic block diagram of another preferred embodiment of an electro-optic electromagnetic field sensor system in accordance with the present invention.

FIG. 11 shows a schematic block diagram of another preferred embodiment of an electro-optic electromagnetic field sensor system of the present invention. The sensor includes a resonator type sensor generally designated 16b'. The system comprises a tunable narrowline laser source 12a, optical isolator 60, bias control circuitry 18, signal capture and display 26, low frequency detector 24a, broadband detector 24b, and the sensor 16b'. The sensor 16b' is located at an electromagnetic field sensing site 28 and includes a splitter 40, sensing resonator 42b, and reference resonator 44b, as described with reference to FIG. 5 above. The sensing resonator 42b includes waveguide 53, electrodes 51, antennas 54, and reflective mirrors 62. The splitter 40 splits the optical measuring signal received from the laser source 12a through polarization-maintaining fiber 30 to provide a portion of the optical measuring signal to each of the resonators 42b, 44b. Since the same laser source feeds both resonators through the polarization-maintaining fiber 30, environmental factors affect both resonators the same due to their close proximity on the substrate of sensor 16b'. Thus, electronic comparison of differential movement of resonances can be used to monitor electromagnetic fields.

Each of the outputs from resonators 42b, 44b is coupled to a length of single-mode fiber 32 to detectors 24a, 24b. The reference resonator 44b can be biased to its half-power point using a feedback loop. Controlling the bias of the reference resonator 44b ensures that the sensing resonator 42b is also at its half-power bias point since both resonators have substantially identical resonance. Any variation in the power output of the sensing resonator 42b can then be attributed to electromagnetic fields picked up by the antennas 54 since all other parameters affect both resonators equally.

The laser source 12a emits linearly polarized light which can excite the TE or TM modes in the sensor 16b'. The laser source 12a is aligned to one of the two axes of the polarization-maintaining fiber 30 such that only the TE mode is propagated to the sensor. The optical isolator 60 prevents back reflected light from reaching the laser source that would make the laser unstable.

The laser source 12a is a narrowline laser, such as a laser source provided by Lightwave Electronics which can be coarsely tuned over 30 GHz and finely tuned in 30 MHz increments.

A Fabry-Perot resonator is considered biased at the optical wavelength that places small signal operation at the steep slope of the resonance curve, e.g., from 50 to 75% of maximum light transmission, depending on the finesse of the resonator (see FIG. 4). Thus, the bias of sensor 16b' can be remotely adjusted by controlling the wavelength of the tunable narrowline laser source 12a. The bias control circuitry 18 provides a bias control signal 17 to adjust the wavelength of laser 12a. The bias control signal 20 includes a small AC test signal which is used for feedback control. The bias control circuitry 18 can include fine and coarse control circuits as described above in relation to the embodiment shown in FIG. 6.

There are several advantages for each of the two types of sensor systems discussed above. The optical resonator based sensor system can employ an electro-optic sensor that is small in size (on the order of 1 mm). The resonator can be made single-ended without bends. Since only the TE mode is propagated through to the sensor, there is no TE/TM phase sensitivity. Because the resonator system does not employ a phase modulator, a higher optical throughput can be provided. For the optical polarization mixing based sensor system, a tunable narrow line laser source is not required. The sensor itself allows for simpler device fabrication. Since the polarization mixing based device employs traveling wave electrodes, a high bandwidth sensor can be provided.

The sensors described above are double-ended devices in which an optical measuring signal enters the device through an input fiber at one end of the device and exits through an output fiber at the other end. In a single-ended sensor, an optical measuring signal enters and exits the sensor device at the same end using either input and output fibers or a single input/output fiber. A single-ended sensor can be inserted into a tight microwave cavity where it can then be maneuvered around bends and other components in the cavity. Several alternative embodiments of single-ended sensors of both the resonator and polarization mixing types will now be described.

Figure 12:
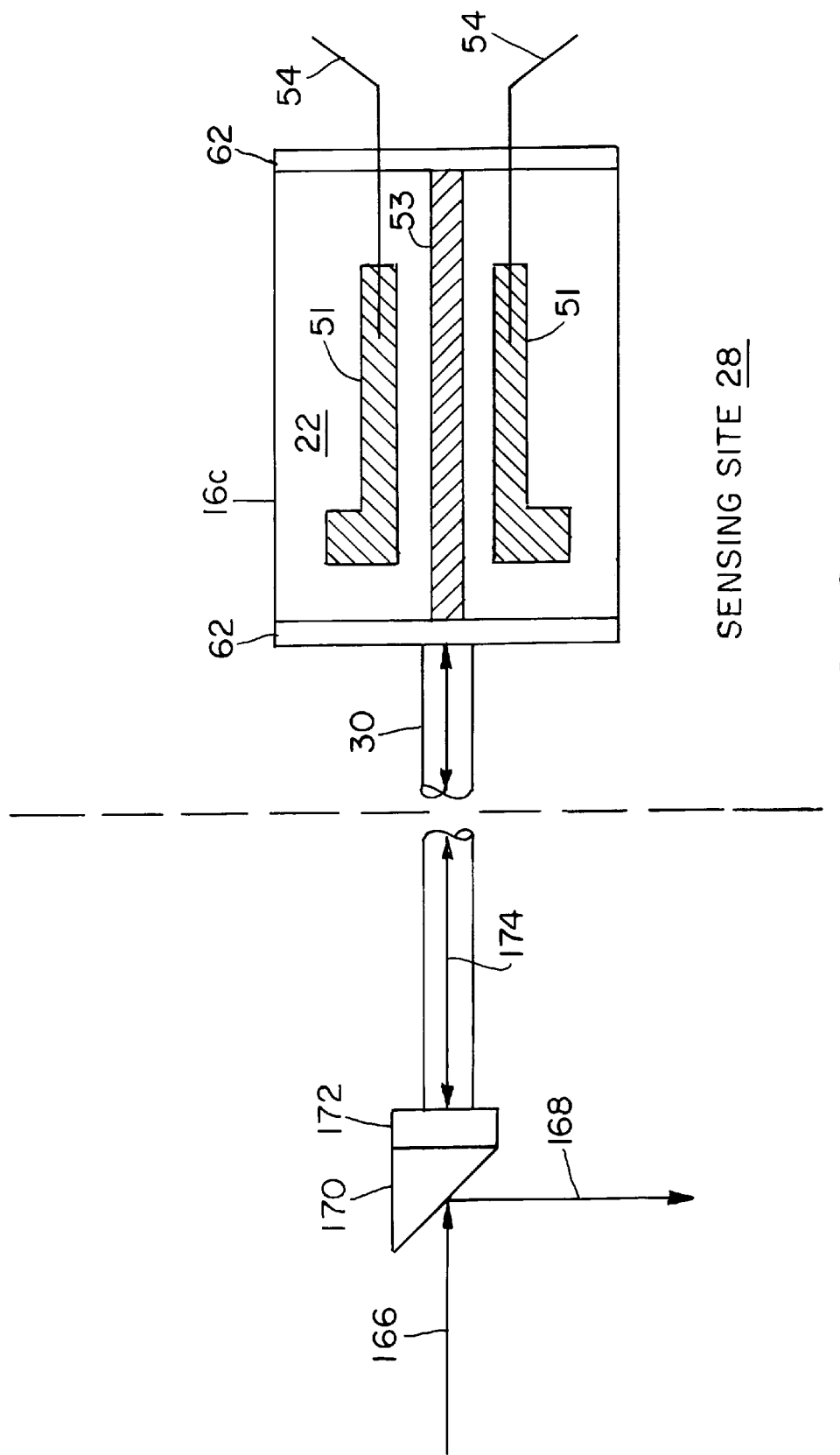
FIG. 12 is a schematic diagram of a single-ended resonator-type sensor in accordance with the present invention.

A preferred embodiment of a single-ended Fabry-Perot etalon sensor is shown in FIG. 12. A resonator sensor 16c located at a sensing site 28 is fabricated similar to the sensor 16b shown in FIG. 3. However, instead of having an input fiber and an output fiber at opposite ends of the device, a single polarization-maintaining fiber 30 is coupled to one end which propagates both input and output light. An incident light beam 166 of TE mode passes through a polarization splitting prism 170 to a Faraday rotation plate 172 which rotates the beam 45 degrees. The polarization-maintaining fiber 30 is aligned at 45 degrees with respect to its slow and fast axes to propagate the forward beam 174. Upon reflection from the resonator 16c, a back-propagating beam then passes through an additional 45 degree rotation in the Faraday plate 172 to provide a 90 degree back-propagating beam at the prism 170. The back-propagating beam 168 exits the prism 170 at 90 degrees with respect to the incident beam 166.

In alternative embodiment, the prism and Faraday plate combination can be replaced with a 3 dB directional coupler to provide the separation of input and output light beams. A drawback of this approach is that a 6 dB loss is incurred between input and output (i.e., 3 dB for each pass through the coupler).

Figure 13:
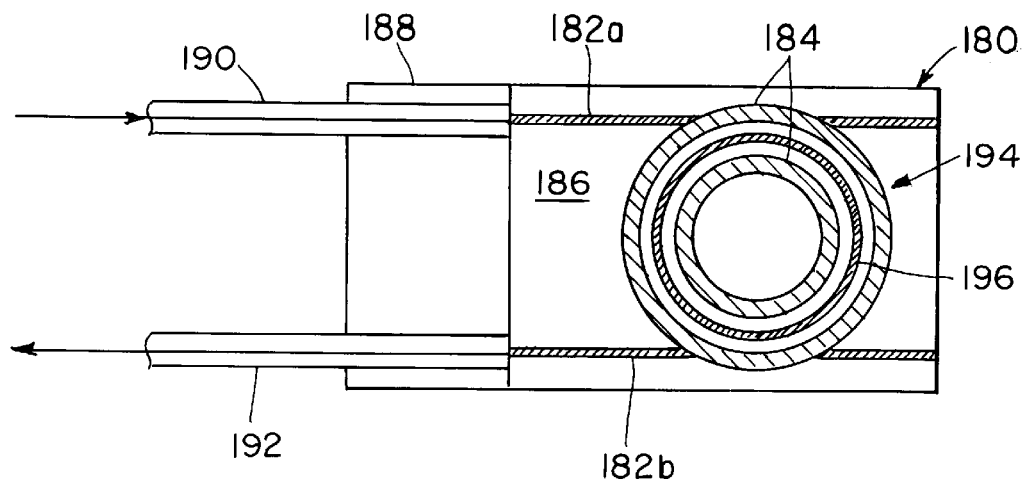
FIG. 13 is a schematic diagram of a single-ended ring resonator-type sensor in accordance with the present invention.

A preferred embodiment of a single-ended ring resonator-type sensor 180 is shown in FIG. 13. The resonator 180 comprises a central ring 194 and a pair of single-ended waveguides 182a, 182b fabricated on substrate 186. Input and output fibers 190 and 192, respectively, disposed in fiber carrier 188 are coupled to one end of the sensor device 180. The central ring 194 includes a circular waveguide 196 formed between concentric electrodes 184. The central ring 194 resonates at a characteristic optical frequency determined by the physical radius and the index in waveguide 196 which varies with the voltage applied through electrodes 184. Therefore, coupling from waveguide 182a to waveguide 182b occurs only when light injected on input fiber 190 is near the resonant frequency. The circular waveguide 196 can be designed near cut-off to enhance the optical decay rate or frequency response of the sensor 180.

Figure 14:
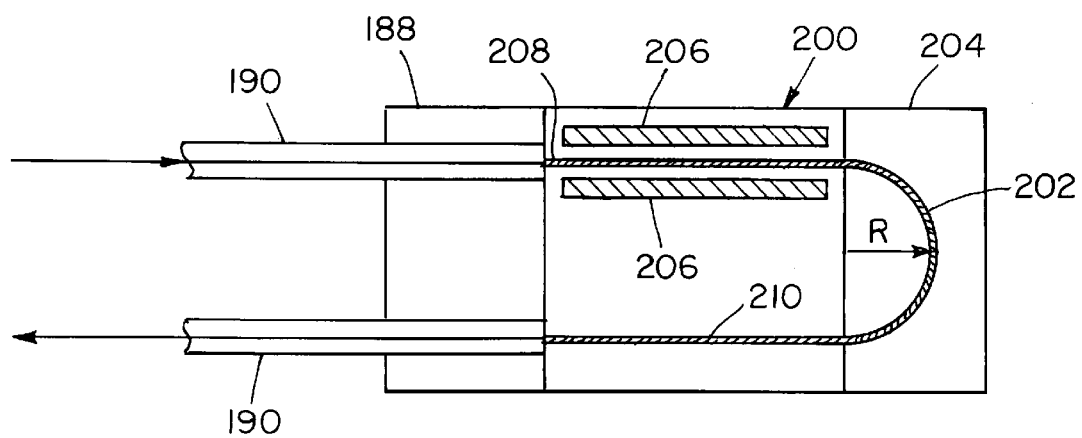
FIG. 14 is a schematic diagram of a single-ended sensor of the polarization mixing type having an ion exchanged glass guide for loopback in accordance with the present invention.

Either of the earlier described double-ended sensor devices (FIGS. 2–3) can be reconfigured as single-ended devices through the use of a tight loopback radius such as is provided with ion-exchanged glass waveguides. Referring to FIG. 14, a single-ended sensor 200 of the polarization mixing type is shown having electrodes 206 and in which an ion-exchanged glass guide 202 formed on glass substrate 204 and having a bend radius R is coupled to one end of the device to provide an optical loopback. The glass guide 202 couples light from sensor waveguide 208 to a return waveguide 210.

Figure 15:
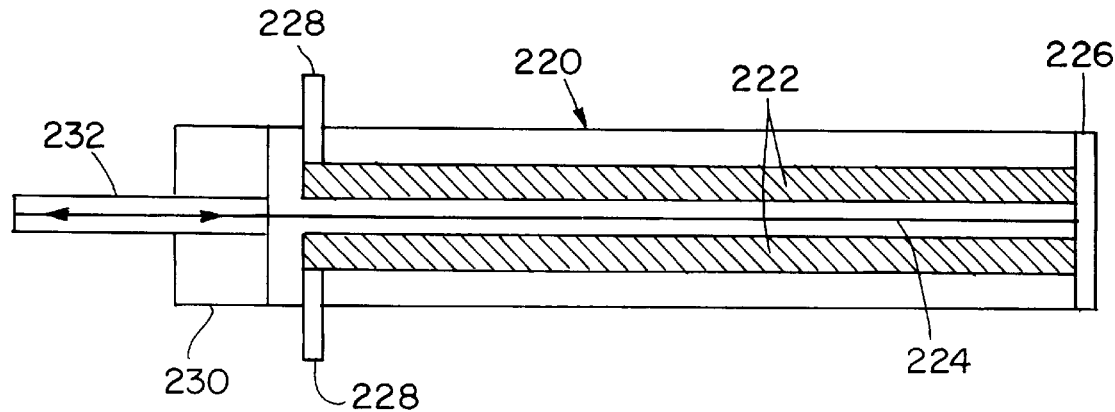
FIG. 15 is a schematic diagram of a single-ended sensor of the polarization mixing type having a reflective facet.

Another approach is to use a reflective facet at one end of a polarization mixing sensor device as shown in FIG. 15. The sensor 220 includes electrodes 222 and a waveguide 224 that terminates an optical signal at reflective facet 226 where the optical signal is then reflected back and exits through the single input/output fiber 232 disposed in fiber carrier 230. Matched impedances 228 are coupled to electrodes 222. The electrodes 222 are terminated in the same manner as the optical signal (i.e., a short circuit), which makes the electrical signal follow the optical signal after the optical signal doubles back on itself at the reflective facet 226. The returning electrical signal then terminates in the source impedance 228 which is the antenna impedance. The antenna impedances are matched to the traveling wave impedance of the electrodes 222. Therefore, the electrical signal follows the optical signal throughout the full optical path. As a result, the length of the device is halved. One concern is that the returning electrical signal not damage the source. Where the source is the antenna, the reflected electrical signal is simply re-radiated from the antenna. For continuous wave measurements it is possible that this re-radiation can make the sensor even more efficient for the case where the phase delay is an integer multiple of $2\pi$. For pulse measurements, the re-radiation can cause "echo" pulses from the sensor.

Having described preferred embodiments of the sensor system of the present invention, antenna arrangements for use in the sensor systems will now be described. Sensor systems known in the art typically use dipole or loop antenna designs. In one preferred embodiment, the present invention instead uses a 3-dimensional biconical antenna arrangement, referred to as a D-dot design, which provides better impedance matching.

Sensors of the polarization mixing type (FIG. 2) tend to be on the order of about one centimeter in length wherein the electrodes can be modeled as traveling wave electrodes. A chip resistor is added for terminating the traveling wave electrodes. A significant degree of freedom of choice in the line impedance can be accommodated. However, the traveling wave impedance is confined to a real resistance for best standing wave reflection performance.

For resonator type sensors (FIGS. 3 and 5), the electrode lengths can be on the order of 2 to 3 millimeters. Thus, the electrode load on the antenna of such a resonator-type sensor appears as a lumped capacitance of about 0.2 pF, depending on the electrode gap. Broadband antennas typically have a frequency dependent impedance. With a small lumped capacitor, it is now possible to accommodate complex antenna impedances with proper complex termination impedances at the resonator electrodes.

Figure 16:
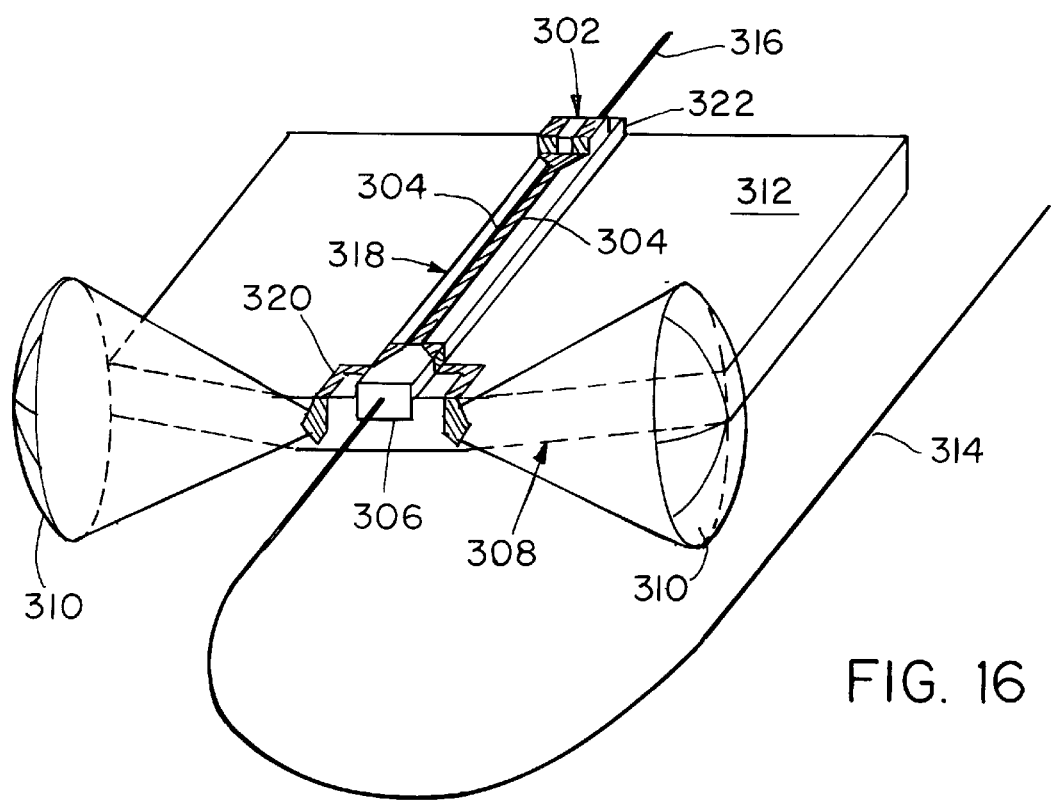
FIG. 16 is a schematic diagram of a 3-dimensional biconical antenna arrangement in accordance with the present invention.

Referring to FIG. 16, an embodiment of the D-dot antenna design is there shown in a polarization mixing-type sensor. The embodiment comprises a phase modulator 318 fabricated on a substrate 322 which is disposed in a channel 306 of a backing plate 312. The modulator 318 includes a pair of electrodes 304 which are terminated in chip resistor 302 on the substrate 322. Input and output fibers 314 and 316, respectively, are used to couple the sensor to a sensor system of the type described above (FIG. 6).

Three-dimensional biconical antenna sections 310 are mounted on an edge of the backing plate 312 using epoxy or other suitable material. Copper tape 320 is used to establish electrical contact between the antenna sections 310 and the electrodes 304. To minimize perturbation of the measured electromagnetic field, the backing plate is made of a material such as teflon or glass which have low RF dielectric constants. Other polymer materials can be used for the backing plate to further reduce the dielectric perturbations over a broader field frequency range.

Two dimensional antenna designs which are easier to fabricate can also be used in sensors of the present invention. Such two dimensional antennas are more directional in performance. Two dimensional antenna designs can include metallic dipoles, bow-tie and horn patterns, and log periodic dipoles.

Figure 17:
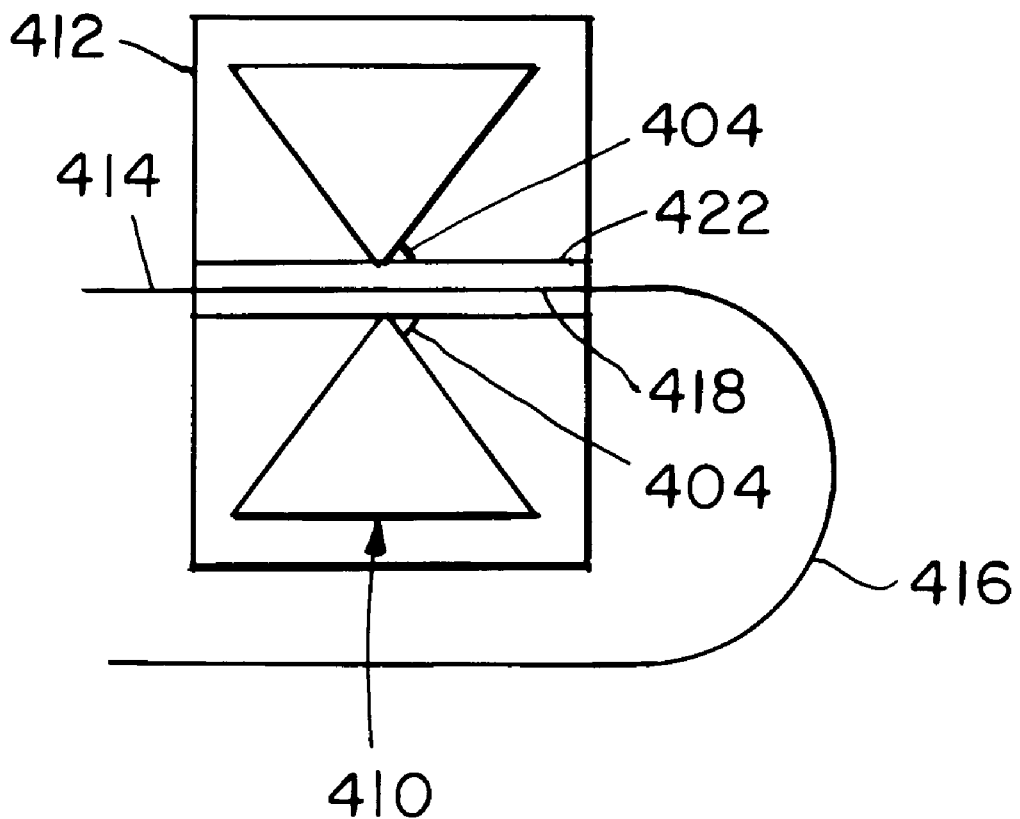
FIG. 17 is a schematic diagram of a 2-dimensional bow-tie pattern antenna arrangement in accordance with the present invention.

Referring to FIG. 17, an embodiment is shown having a bow-tie pattern antenna design. The embodiment comprises a sensor 418 fabricated on a substrate 422 which is attached to a backing plate 412 of the type described above. Input and output fibers 414 and 416, respectively, are used to couple the sensor to a sensor system. Using photolithography, antenna sections 410 are fabricated in a bow-tie pattern on the top surface of backing plate 412. The two-dimensional antenna sections 410 are electrically coupled to electrodes 404. The bow-tie antenna design is a projection of the 3-dimensional D-dot arrangement that is easier to fabricate and more directional in performance.

Applications of the preferred embodiments of the electro-optic electromagnetic field sensor systems of the present invention include, but are not limited to, field mapping of enclosures, instrument landing systems, radar detection, and electrical neural activity monitoring.

While this invention has been particularly shown and described with references to preferred embodiments thereof, it will be understood by those skilled in the art that various changes in form and details may be made therein without departing from the spirit and scope of the invention as defined by the appended claims.

What is claimed is:

1. An electro-optic electromagnetic field sensor system comprising:

a laser source for providing an optical measuring signal;

an electro-optic sensor optically coupled to the laser source for detecting an intensity of an electromagnetic field and for changing the optical measuring signal to an optical sensor signal that is representative of the field intensity;

an optical bias adjust unit optically coupled to the laser source for adjusting the bias operating point of the sensor;

a detector optically coupled to the sensor for converting the optical sensor signal to an electrical sensor signal;

an optical input fiber for coupling the optical measuring signal from the laser source to the sensor;

an optical output fiber for coupling the optical sensor signal to the detector such that the electro-optic sensor is located at a field sensing site and the laser source, optical bias adjust unit, and detector are located remote from the field sensing site.

2. The system of claim 1 wherein the optical bias adjust unit is responsive to an electrical bias control signal having a test signal component and the detector is operative to detect a feedback signal indicative of the transfer function of the sensor operating on the test signal component and wherein the system further comprises a bias control circuit electrically coupled to the optical bias adjust unit for generating the bias control signal responsive to the feedback signal received from the detector.

3. The system of claim 1 wherein the electro-optic sensor comprises a Fabry-Perot resonator.

4. The system of claim 1 wherein the electro-optic sensor comprises a polarization mixing sensor.

5. The system of claim 4 wherein the optical measuring signal comprises first and second polarized optical components which are orthogonal to each other and wherein the polarization mixing sensor comprises:

an antenna section for detecting an intensity of an electromagnetic field and producing an electrical intensity signal having an amplitude proportional to the field intensity;

a phase modulator optically coupled to the laser source and electrically coupled to the antenna section for changing a phase of one of the first and second polarized optical components of the optical measuring signal in an amount proportional to the amplitude of the electrical intensity signal from the antenna section; and an optical polarization mixer optically coupled to the phase modulator for optically mixing the first and second polarized optical components received from the phase modulator to produce an optical amplitude modulation signal proportional to a phase difference between the first and second polarized optical components.

6. The system of claim 5 wherein the optical polarization mixer comprises an optical polarizing fiber.

7. The system of claim 5 wherein the optical polarization mixer comprises a polarizer plate.

8. The system of claim 5 wherein the antenna section includes a three-dimensional biconical antenna.

9. The system of claim 5 wherein the antenna section includes a two-dimensional bow-tie pattern antenna.

10. The system of claim 1 further comprising an ion exchanged glass waveguide formed at a curve on a glass substrate and coupled to the electro-optic sensor wherein the waveguide couples light from the sensor to a return waveguide formed alongside the sensor such that the sensor is single-ended.

11. An electro-optic electromagnetic field sensor system comprising:

a laser source for providing an optical measuring signal having first and second polarized optical components which are orthogonal to each other;

an antenna section for detecting an intensity of an electromagnetic field and producing an electrical intensity signal having an amplitude proportional to the electromagnetic field intensity;

a phase modulator optically coupled to the laser source and electrically coupled to the antenna section for changing a phase of one of the first and second polarized optical components of the optical measuring signal in an amount proportional to the amplitude of the electrical intensity signal from the antenna section;

an optical polarization mixer optically coupled to the phase modulator for optically mixing the first and second polarized optical components received from the phase modulator to produce an optical amplitude modulation signal proportional to a phase difference between the first and second polarized optical components;

a detector optically coupled to the optical polarization mixer for converting the optical amplitude modulation signal to an electrical amplitude modulation signal;

an optical input polarization-maintaining fiber for coupling the first and second polarized optical components of the optical measuring signal from the laser source to the phase modulator; and an optical output fiber for coupling the optical amplitude modulation signal to the detector such that the phase modulator and the antenna section are located at an electromagnetic field sensing site and the laser source and detector are located remote from the electromagnetic field sensing site.

12. The system of claim 11 wherein the optical polarization mixer comprises an optical polarizing fiber.

13. The system of claim 11 wherein the optical polarization mixer comprises a polarizer plate.

14. The system of claim 11 further comprising:

a bias control circuit for providing a bias control signal; and a second phase modulator optically coupled to the laser source at the remote site and electrically coupled to the bias control circuit for changing a phase of one of the first and second polarized optical components of the optical measuring signal responsive to the bias control signal.

15. The system of claim 11 wherein the detector further detects a feedback signal indicative of the transfer function of the phase modulator operating on a test signal and wherein the system further comprises:

an optical bias adjust unit optically coupled to the laser source at the remote site for adjusting the bias operating point of the phase modulator responsive to an electrical bias control signal; and a bias control circuit electrically coupled to the optical bias adjust unit for generating the bias control signal responsive to the feedback signal received from the detector and for generating the test signal.

16. The system of claim 15 wherein the optical bias adjust unit includes a second phase modulator for changing a phase of one of the first and second polarized optical components of the optical measuring signal responsive to the bias control signal and wherein the second phase modulator is located remote from the electromagnetic field sensing site.

17. The system of claim 11 further comprising:

a splitter for splitting the optical measuring signal; and a reference waveguide formed on a substrate wherein the phase modulator is located in proximity to the reference waveguide on the substrate, the reference waveguide receiving a portion of the optical measuring signal from the splitter for adjusting for environmental effects on the phase modulator response.

18. An electro-optic electromagnetic field sensor system comprising:

a laser source for providing an optical measuring signal having first and second polarized optical components which are orthogonal to each other;

an antenna section for detecting an intensity of an electromagnetic field and producing an electrical intensity signal having an amplitude proportional to the electromagnetic field intensity;

a resonator coupled to the laser source and electrically coupled to the antenna section for changing the amplitude of one of the first and second polarized optical components of the optical measuring signal in an amount proportional to the amplitude of the electrical intensity signal from the antenna section to produce an optical amplitude modulation signal;

a detector coupled to the resonator for converting the optical amplitude modulation signal to an electrical amplitude modulation signal;

an optical input polarization-maintaining fiber for coupling one of the first and second polarized optical components of the optical measuring signal from the laser source to the resonator; and an optical output fiber for coupling the optical amplitude modulation signal to the detector such that the resonator and the antenna section are located at an electromagnetic field sensing site and the laser source and detector are located remote from the electromagnetic field sensing site.

19. The system of claim 18 further comprising:

a bias control circuit for providing a bias control signal; and wherein the laser source includes a tunable narrow-line laser responsive to the bias control signal to adjust the laser source wavelength.

20. The system of claim 18 wherein the detector further detects a feedback signal indicative of the transfer function of the resonator operating on a test signal and wherein the laser source includes a tunable narrow-line laser responsive to a bias control signal to adjust the laser source wavelength and wherein the system further comprises a bias control circuit for generating the bias control signal responsive to the feedback signal and for generating the test signal.

21. The system of claim 18 further comprising:

a splitter for splitting the optical measuring signal; and a reference waveguide formed on a substrate wherein the resonator is located in proximity to the reference waveguide on the substrate, the reference waveguide receiving a portion of the optical measuring signal from the splitter for adjusting for environmental effects on the resonator response.

22. An electro-optic electromagnetic field sensor system comprising:

a laser source for providing an optical measuring signal;

a splitter for splitting the optical measuring signal, an optical input fiber coupling the optical measuring signal from the laser source to the splitter;

an electro-optic sensor formed on a substrate for detecting an intensity of an electromagnetic field, the sensor receiving a first portion of the optical measuring signal from the splitter to provide an optical sensor signal that is representative of the field intensity;

an optical bias adjust unit coupled to the laser source for adjusting the bias operating point of the sensor responsive to an electrical bias control signal having a test signal component;

a reference waveguide formed on the substrate in proximity to the electro-optic sensor for adjusting for environmental effects on the sensor, the reference waveguide receiving a second portion of the optical measuring signal from the splitter to provide an optical feedback signal indicative of the transfer function of the sensor operating on the test signal component;

a first detector coupled to the sensor for converting the optical sensor signal to an electrical sensor signal;

a second detector coupled to the reference waveguide for converting the optical feedback signal to an electrical feedback signal;

a bias control circuit electrically coupled to the optical bias adjust unit for generating the bias control signal responsive to the feedback signal received from the second detector;

a first optical output fiber for coupling the optical sensor signal to the first detector; and a second optical output fiber for coupling the optical feedback signal to the second detector.

23. The system of claim 22 wherein the electro-optic sensor comprises a Fabry-Perot resonator.

24. The system of claim 22 wherein the electro-optic sensor comprises a polarization mixing sensor.

25. The system of claim 24 wherein the optical measuring signal comprises first and second polarized optical components which are orthogonal to each other and wherein the polarization mixing sensor comprises:

an antenna section for detecting an intensity of an electromagnetic field and producing an electrical intensity signal having an amplitude proportional to the field intensity;

a phase modulator electrically coupled to the antenna section for changing a phase of one of the first and second polarized optical components of the optical measuring signal in an amount proportional to the amplitude of the electrical intensity signal from the antenna section; and an optical polarization mixer coupled to the phase modulator for optically mixing the first and second polarized optical components received from the phase modulator to produce an optical amplitude modulation signal proportional to a phase difference between the first and second polarized optical components.

26. The system of claim 25 wherein the optical polarization mixer comprises an optical polarizing fiber.

27. The system of claim 25 wherein the optical polarization mixer comprises a polarizer plate.

28. For use in an electro-optic electromagnetic field sensor system having a laser source for providing an optical measuring signal and a splitter for splitting the optical measuring signal, apparatus comprising:

an electro-optic sensor formed on a substrate for detecting an intensity of an electromagnetic field, the sensor receiving a first portion of the optical measuring signal from the splitter to provide an optical sensor signal that is representative of the field intensity; and a reference waveguide formed on the substrate in proximity to the electro-optic sensor for adjusting for environmental effects on the sensor, the reference waveguide receiving a second portion of the optical measuring signal from the splitter to provide an optical feedback signal indicative of the transfer function of the sensor.

29. The apparatus of claim 28 wherein the electro-optic sensor comprises a Fabry-Perot resonator.

30. The apparatus of claim 28 wherein the electro-optic sensor comprises a polarization mixing sensor.

31. The apparatus of claim 28 wherein the electro-optic sensor and the reference waveguide are fabricated on a lithium niobate substrate by titanium diffusion.

32. The apparatus of claim 28 wherein the electro-optic sensor and the reference waveguide are fabricated on a lithium niobate substrate by proton exchange.

33. For use in an electro-optic electromagnetic field sensor system having a laser source for providing an optical measuring signal, apparatus comprising:

an electro-optic sensor formed on a lithium niobate substrate for detecting an intensity of an electromagnetic field, the sensor changing the optical measuring signal to an optical sensor signal that is representative of the field intensity;

a return waveguide formed on the lithium niobate substrate in proximity to the sensor; and an optically transmissive substrate having a curvilinear waveguide formed thereon, the waveguide having one end coupled to the electro-optic sensor and the other end coupled to the return waveguide wherein the waveguide couples the optical sensor signal from the sensor to the return waveguide.

34. The apparatus of claim 33 wherein the optically transmissive substrate comprises glass and the curvilinear waveguide comprises an ion-exchanged glass waveguide.

35. The apparatus of claim 33 wherein the electro-optic sensor comprises a Fabry-Perot resonator.

36. The apparatus of claim 33 wherein the electro-optic sensor comprises a polarization mixing sensor.

37. An electro-optic electromagnetic field sensor comprising:

a three-dimensional biconical antenna section for detecting an intensity of an electromagnetic field and producing an electrical intensity signal having an amplitude proportional to the field intensity; and an electro-optic section coupled to the antenna section responsive to the electrical intensity signal to change an optical measuring signal to an optical sensor signal which is representative of the field intensity.

38. The electro-optic sensor of claim 37 wherein the electro-optic section comprises:

a phase modulator formed on a lithium niobate substrate comprising an optical input for receiving an optical measuring signal having first and second polarized optical components and a pair of electrodes coupled to the antenna section responsive to the electrical intensity signal to change a phase of one of the first and second polarized optical components of the optical measuring signal in an amount proportional to the amplitude of the electrical intensity signal from the antenna section.

39. The electro-optic sensor of claim 38 further comprising:

an optical polarization mixer optically coupled to the phase modulator for optically mixing the first and second polarized optical components received from the phase modulator to produce an optical amplitude modulation signal proportional to a phase difference between the first and second polarized optical components.

40. The electro-optic sensor of claim 38 further comprising:

a return waveguide formed on the lithium niobate substrate in proximity to the phase modulator; and an optically transmissive substrate having a curvilinear waveguide formed thereon, the waveguide having one end coupled to the phase modulator and the other end coupled to the return waveguide wherein the waveguide couples the optical sensor signal from the phase modulator to the return waveguide.

41. The electro-optic sensor of claim 40 wherein the optically transmissive substrate comprises glass and the curvilinear waveguide comprises an ion-exchanged waveguide.

42. The electro-optic sensor of claim 37 wherein the electro-optic section comprises:

a resonator formed on a lithium niobate substrate comprising an optical input for receiving an optical measuring signal having first and second polarized optical components and a pair of electrodes coupled to the antenna section responsive to the electrical intensity signal to change the amplitude of one of the first and second polarized optical components of the optical measuring signal in an amount proportional to the amplitude of the electrical intensity signal from the antenna section to produce an optical amplitude modulation signal.

43. An electro-optic electromagnetic field sensor comprising:

a two-dimensional bow-tie pattern antenna section for detecting an intensity of an electromagnetic field and producing an electrical intensity signal having an amplitude proportional to the field intensity; and an electro-optic section coupled to the antenna section responsive to the electrical intensity signal to change an optical measuring signal to an optical sensor signal which is representative of the field intensity.

44. The electro-optic sensor of claim 43 wherein the electro-optic section comprises:

a phase modulator formed on a lithium niobate substrate comprising an optical input for receiving an optical measuring signal having first and second polarized optical components and a pair of electrodes coupled to the antenna section responsive to the electrical intensity signal to change a phase of one of the first and second polarized optical components of the optical measuring signal in an amount proportional to the amplitude of the electrical intensity signal from the antenna section.

45. The electro-optic sensor of claim 44 further comprising:

an optical polarization mixer optically coupled to the phase modulator for optically mixing the first and second polarized optical components received from the phase modulator to produce an optical amplitude modulation signal proportional to a phase difference between the first and second polarized optical components.

46. The electro-optic sensor of claim 44 further comprising:

a return waveguide formed on the lithium niobate substrate in proximity to the phase modulator; and a glass substrate having a curvilinear ion-exchanged glass waveguide formed thereon, the glass waveguide having one end coupled to the phase modulator and the other end coupled to the return waveguide wherein the glass waveguide couples the optical sensor signal from the phase modulator to the return waveguide.

47. The electro-optic sensor of claim 43 wherein the electro-optic section comprises:

a resonator formed on a lithium niobate substrate comprising an optical input for receiving an optical measuring signal having first and second polarized optical components and a pair of electrodes coupled to the antenna section responsive to the electrical intensity signal to change the amplitude of one of the first and second polarized optical components of the optical measuring signal in an amount proportional to the amplitude of the electrical intensity signal from the antenna section to produce an optical amplitude modulation signal.

* * * * *